United States Patent
Son et al.

(10) Patent No.: US 7,364,955 B2
(45) Date of Patent: Apr. 29, 2008

(54) METHODS OF MANUFACTURING SEMICONDUCTOR DEVICES HAVING SINGLE CRYSTALLINE SILICON LAYERS

(75) Inventors: Yong-Hoon Son, Gyeonggi-do (KR); Yu-Gyun Shin, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 238 days.

(21) Appl. No.: 11/121,562

(22) Filed: May 4, 2005

(65) Prior Publication Data

US 2005/0277235 A1    Dec. 15, 2005

(30) Foreign Application Priority Data

Jun. 12, 2004    (KR)    ............. 10-2004-0043265

(51) Int. Cl.
*H01L 21/84* (2006.01)
(52) U.S. Cl. ................. 438/166; 257/E21.561
(58) Field of Classification Search ........ 438/151–166; 257/E21.561
See application file for complete search history.

(56) References Cited

U.S. PATENT DOCUMENTS

| | | | | |
|---|---|---|---|---|
| 4,489,478 A | * | 12/1984 | Sakurai .................. | 438/18 |
| 5,378,644 A | * | 1/1995 | Morihara ................ | 438/294 |
| 5,970,369 A | * | 10/1999 | Hara et al. ............. | 438/488 |
| 5,972,105 A | | 10/1999 | Yamazaki et al. ........ | 117/8 |
| 6,391,695 B1 | * | 5/2002 | Yu ....................... | 438/166 |
| 2005/0202654 A1 | * | 9/2005 | Im ....................... | 438/487 |
| 2005/0233508 A1 | * | 10/2005 | Ushiku .................. | 438/155 |

FOREIGN PATENT DOCUMENTS

| | | |
|---|---|---|
| JP | 2001-044132 A | 2/2001 |
| JP | 2001308008 | 11/2001 |
| JP | 2002359195 | 12/2005 |
| KR | 0379859 B1 | 12/1995 |
| KR | 1020030007093 A | 1/2003 |
| KR | 10 2004 0040762 | 5/2004 |
| KR | 0496139 B1 | 7/2004 |
| KR | 0578787 B1 | 12/2005 |

OTHER PUBLICATIONS

Notice to Submit a Response for Korean Patent Application No. 10-2004-0043265 mailed on Nov. 30, 2005.

* cited by examiner

*Primary Examiner*—Richard A. Booth
(74) *Attorney, Agent, or Firm*—Myers Bigel Sibley & Sajvoec

(57) ABSTRACT

Methods of manufacturing semiconductor devices having at least one single crystal silicon layer are provided. Pursuant to these methods, a first seed layer that includes silicon is formed. A first non-single crystalline silicon layer is then formed on the first seed layer. The first non-single crystalline silicon layer is irradiated with a laser to transform the first non-single crystalline silicon layer into a first single crystalline silicon layer. Corresponding semiconductor devices are also disclosed.

37 Claims, 11 Drawing Sheets

METHODS OF MANUFACTURING SEMICONDUCTOR DEVICES HAVING SINGLE CRYSTALLINE SILICON LAYERS

CROSS-REFERENCE TO RELATED APPLICATION

This application claims priority under 35 U.S.C. § 119 from Korean Patent Application No. 10-2004-43265, filed on Jun. 12, 2004, the disclosure of which is hereby incorporated by reference herein as if set forth in its entirety.

FIELD OF THE INVENTION

The present invention relates to methods of manufacturing semiconductor devices and, more particularly, to methods of manufacturing semiconductor devices that include single crystalline layers and related semiconductor devices.

BACKGROUND OF THE INVENTION

In general, crystalline materials may be classified as single-crystalline (or single crystal), polycrystalline (or poly-crystal) or as amorphous, or as combinations thereof, based on their crystal structure. A single crystalline material is one that has a single crystal unit structure, while a polycrystalline material has a structure comprising a plurality of crystal units. An amorphous material does not include a defined crystal structure, as atoms in amorphous materials may be irregularly bonded to each other. A polycrystalline material typically has many grain boundaries due to the plurality of crystal structure units. The movement of carriers such as electrons and holes may be restricted by these grain boundaries.

In order to reduce and/or minimize such reductions in carrier mobility, single crystalline silicon layers are often used, for example, as the active region of thin film transistors (TFT) that have a stacked structure. A single crystalline silicon layer is one that includes a high density of relatively large single crystal grains. It will be appreciated by those of skill in the art that polycrystalline layers may also have a plurality a single crystal units contained therein, but the size of the grains and the density of large grains is substantially smaller. Generally, a layer is considered to comprise a single crystalline semiconductor layer as opposed to a polycrystalline (or other) layer when the layer contains a high density of single crystal grains that exhibit long-range translational symmetry.

To form a single crystal silicon layer, an amorphous silicon layer may be formed on an insulation layer, and a heat treatment is performed on the amorphous silicon layer to form the single crystalline silicon layer. Methods of forming single crystalline silicon layers are disclosed, for example, in Japanese Patent Publication No. 2001-308008, Japanese Patent Publication No. 2002-359159 and U.S. Pat. No. 5,972,105.

In the method disclosed in Japanese Patent Publication No. 2001-308008, an amorphous silicon layer is formed on a silicon substrate. The amorphous silicon layer is then heat treated in a furnace that is maintained, for example, at a temperature of about 500° C. to about 700° C. As a result of this heat treatment, a silicide layer is formed on a surface of the silicon substrate to thereby obtain the single crystalline silicon layer. The above Japanese Publication Patent discloses methods of forming single crystalline silicon layers that both do and do not use a silicon seed.

When a single crystalline silicon layer is formed without a silicon seed according to the methods disclosed in the above-referenced Japanese patent publication, it may be difficult to enlarge the grain in the single crystalline silicon layer because the nucleation sites may be randomly distributed in the amorphous silicon layer. While it may be easier to enlarge the grain size of the single crystals when the single crystalline silicon layer is formed using a silicon seed, processing failures may be generated on a boundary surface of the silicon substrate.

Japanese Patent Publication No. 2002-359159 discloses a method of forming a single crystal silicon layer in which an amorphous silicon layer is formed into a seed by a first heat treatment that is applied using a laser. The amorphous silicon layer is then formed into a single crystalline silicon layer by a second heat treatment that is also applied using a laser. This method may involve the use of a photoresist pattern during the first heat treatment that forms the seed, and the method may use the laser twice in forming the single crystalline silicon layer.

SUMMARY OF THE INVENTION

Pursuant to embodiments of the present invention, methods of manufacturing semiconductor devices having at least one single crystal silicon layer are provided. Pursuant to these methods, a first seed layer that includes silicon is formed on a substrate. A first non-single crystalline silicon layer is then formed on the first seed layer. The first non-single crystalline silicon layer is irradiated with a laser to transform the first non-single crystalline silicon layer into a first single crystalline silicon layer.

The silicon in the first seed layer may act as a seed for crystallization of the first non-single crystalline layer. In certain embodiments of the present invention, the first seed layer may be formed using a selective epitaxial growth (SEG) process such as, for example, a vapor phase epitaxy process. The laser may be used to liquefy substantially all of the first non-single crystalline silicon layer. In certain embodiments of the present invention, the structure is heated at a temperature of about 200° C. to about 600° C. during the laser irradiation. The first non-single crystalline silicon layer may, for example, comprise an amorphous silicon layer.

In certain embodiments, the methods may further include forming a second seed layer that includes silicon on the first single crystalline silicon layer. A second non-single crystalline silicon layer may be formed on the second seed layer. The second non-single crystalline silicon layer may be irradiated with a laser to transform the second non-single crystalline silicon layer into a second single crystalline silicon layer. Thereafter, a third seed layer that includes silicon may be formed on the second single crystalline silicon layer. A third non-single silicon crystalline layer may be formed on the third seed layer. The third non-single crystalline silicon layer may be irradiated with a laser to transform the third non-single crystalline silicon layer into a third single crystalline silicon layer.

The laser may be irradiated onto the first non-single crystalline silicon layer at a sufficient intensity to liquefy the first non-single crystalline silicon layer through substantially its whole thickness. This may be accomplished, for example, in less than about 100 nanoseconds. In certain embodiments of the present invention, the liquefied first non-single crystalline silicon layer does not flow onto the surface of the seed layer.

The first seed layer and the first non-single crystalline silicon layer may have different absorption coefficients such that they absorb energy from the laser at different rates. The first single crystalline silicon layer and the first seed layer may have substantially the same Miller's index. The method may further include heating the first seed layer using a heating source separate from the laser during at least part of the time during which the laser is irradiated onto the first non-single crystalline silicon layer.

Pursuant to further embodiments of the present invention, methods of manufacturing semiconductor devices are provided. Pursuant to these methods, a first single crystalline silicon layer is provided. A first insulation layer is formed on the first single crystalline silicon layer. The first insulation layer includes an opening that exposes a surface of the first single crystalline silicon layer. A first seed layer that includes silicon is formed in the opening. A non-single crystalline silicon layer is formed on the first insulation layer and the first seed layer. The non-single crystalline silicon layer is transformed into a second single crystalline silicon layer using the silicon in the first seed layer as a seed for crystallization during a phase change of the non-single crystalline silicon in the non-single crystalline silicon layer that is induced by application of a laser.

In these methods, the first single crystalline silicon layer may comprise, for example, a silicon substrate or a silicon-on-insulator (SOI) substrate. The non-single crystalline silicon layer may be, for example, an amorphous silicon layer. The second single crystalline silicon layer and the first seed layer may have substantially the same Miller's index. The first seed layer may be formed, for example, using a selective epitaxial growth process. The transformation of the non-single crystalline silicon layer into the second single crystalline silicon layer may involve dissolving the non-single crystalline silicon layer using the laser and then recrystallizing the dissolved non-single crystalline silicon layer into the second single crystalline silicon layer using the first seed layer as a seed during the recrystallization process.

In these methods, a semiconductor structure may be formed on the first single crystalline silicon layer prior to forming the first seed layer. The method may also include polishing the first seed layer until an inlet portion of the opening is exposed. The laser may be irradiated onto the non-single crystalline silicon layer at a sufficient intensity to liquefy the non-single crystalline silicon layer through substantially its whole thickness. Moreover, the process may be performed such that the liquefied non-single crystalline silicon layer does not flow onto the surface of the seed layer. In these methods, the seed layer and the non-single crystalline silicon layer may have different absorption coefficients. Additionally, in certain embodiments, the first seed layer may be heated using a heating source that is separate from the laser during at least part of the time during which the laser is irradiated onto the non-single crystalline silicon layer.

Pursuant to further embodiments of the present invention, semiconductor devices are provided that include a first seed layer that includes silicon and a first single crystalline silicon layer that is formed on the first seed layer by transforming the crystal structure of an amorphous silicon layer into a single crystal structure using the silicon in the first seed layer as a seed for crystallization during a phase change of the amorphous silicon by a laser. The first seed layer may be an epitaxial layer formed by a selective epitaxial growth (SEG) process such as, for example, a vapor phase epitaxy process. The semiconductor device may also include a second seed layer that includes silicon on the first single crystalline silicon layer and a second single crystalline silicon layer on the second seed layer.

Pursuant to still further embodiments of the present invention, semiconductor devices are provided that include a first single crystalline silicon layer. A first insulation layer is formed on the first single crystalline silicon layer. The first insulation layer includes an opening that exposes a surface of the first single crystalline silicon layer. A first seed layer that includes silicon is provided in the opening. A second single crystalline silicon layer is provided on the first insulation layer by transforming a crystal structure of an amorphous silicon layer including an amorphous material into a single crystal structure using the silicon in the first seed layer as a seed for crystallization during a phase change of the amorphous silicon induced by a laser. In these devices, the first single crystalline silicon layer may be, for example, a silicon substrate or a silicon-on-insulator (SOI) substrate. The first seed layer may be an epitaxial layer that is formed by a selective epitaxial growth (SEG) process. A semiconductor structure may be on the first single crystalline silicon layer.

BRIEF DESCRIPTION OF THE DRAWINGS

The above and other features and advantages of the present invention will become readily apparent by reference to the following detailed description when considering in conjunction with the accompanying drawings, in which.

DETAILED DESCRIPTION

Figure 1:
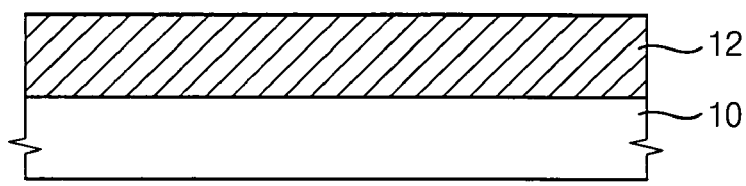
FIG. 1 is a cross-sectional diagram illustrating a semiconductor device according to a first exemplary embodiment of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional diagram illustrating semiconductor devices according to first exemplary embodiments of the present invention. As shown in FIG. 1, the semiconductor devices according to the first embodiments of the present invention include a seed layer 10 and a single crystalline silicon layer 12 that is formed on the seed layer 10.

The seed layer 10 may, for example, comprise silicon. The seed layer 10 may be formed, for example, by a selective epitaxial growth (SEG) process. The SEG process may include a liquid phase epitaxy process, a vapor phase epitaxy process or a molecular beam epitaxy process. In the description of this embodiment below, a vapor phase epitaxy process is used to form the seed layer 10.

The single crystalline silicon layer 12 may be formed on the seed layer 10 by transforming the crystal structure of an amorphous silicon layer (not shown) into a single crystal structure using the silicon in the seed layer 10 as a seed for crystallization during a phase change of the amorphous silicon by a laser. The structure transformation may progress along both a vertical and a lateral direction on the surface of the amorphous silicon layer. An amorphous silicon layer is formed on the seed layer 10. The amorphous silicon layer is then irradiated using a laser to transform the amorphous silicon layer into the single crystalline silicon layer 12. The phase of the amorphous silicon layer is changed into a liquid phase due to the laser, and thus the silicon in the seed layer 10 functions as a seed for crystallization. The phase change and the crystal structure transformation of the amorphous silicon layer may be carried out in as little as a few nanoseconds, and thus the amorphous silicon layer may not flow down onto the surface of the seed layer even though the amorphous silicon layer is liquefied.

In certain embodiments of the present invention, the laser may be irradiated onto the amorphous silicon layer at a sufficient intensity to liquefy the amorphous silicon layer through its whole thickness so that the amorphous silicon layer is liquefied though the top surface thereof to the bottom surface that makes contact with the seed layer. In these embodiments, the energy of the laser may be determined based on the thickness of the amorphous silicon layer, and thus is not limited to some region. Herein, the energy of the laser is referred to as an approximation of the temperature of the irradiated portion of the amorphous silicon layer, which is hereinafter referred to as the liquefied temperature. In certain embodiments of the present invention, the laser may, for example, have energy corresponding to the liquefied temperature, no less than about 1,410° C., while taking into consideration that the melting point of the amorphous silicon layer is about 1,410° C.

The laser causes a phase change in the amorphous silicon layer. However, the laser may not cause a corresponding phase change in the seed layer under the amorphous silicon layer because the absorption coefficient of the seed layer may be different from the absorption coefficient of the amorphous silicon layer. In one specific embodiment of the present invention, the laser may comprise an excimer laser that, for example, scans the whole surface of the amorphous silicon layer at a time in order to reduce the irradiation time of the laser.

The resulting structure including the seed layer and the amorphous silicon layer may, in certain embodiments of the present invention, be heated while the laser is irradiated onto the amorphous silicon layer, which may facilitate reducing and/or preventing the laser from causing a temperature gradient at the irradiated portion of the amorphous silicon layer and/or to facilitate formation of larger single crystalline grains at the irradiated portion.

In exemplary embodiments of the present invention, the resulting structure is exemplarily heated to a temperature of about 200° C. to about 600° C. In many embodiments, the structure may be heated to a temperature of about 350° C. to about 450° C. In one specific embodiment, the structure is heated to a temperature of about 400° C.

Thus, pursuant to certain embodiments of the present invention, the amorphous silicon layer formed on the seed layer 10 may be transformed into a single crystalline silicon layer 12 by laser irradiation in a very short time of, for example, a few nanoseconds or less, although longer times may also be used. As the silicon in the seed layer 10 may act as a seed for crystallization, the size of the grains in the single crystalline silicon layer may be enlarged, and the single crystalline silicon layer may have the same general crystal structure as the seed layer 10 in that it may have the same Miller's index as that of the seed layer. The semiconductor devices produced according to these first embodiments of the present invention may have a single crystalline silicon layer that includes a relatively high density of large grains, which may facilitate the formation of highly integrated semiconductor devices.

Figure 2:
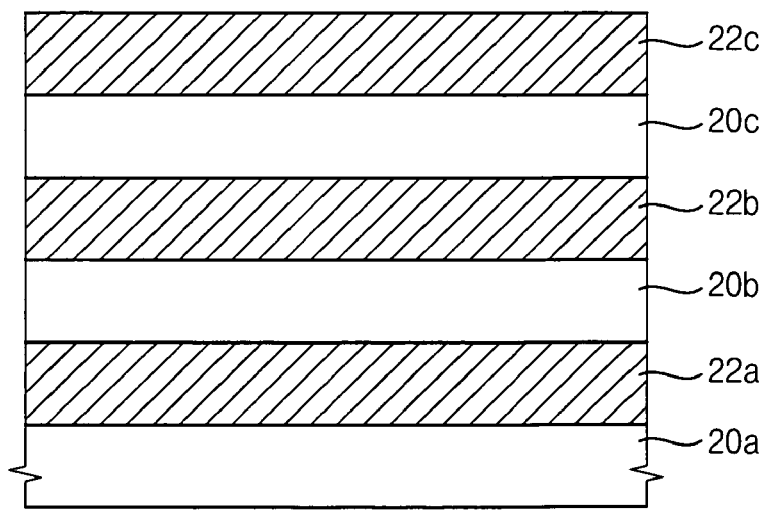
FIG. 2 is a cross-sectional diagram illustrating a semiconductor device according to a second exemplary embodiment of the present invention.

FIG. 2 is a cross-sectional diagram illustrating a semiconductor device according to second embodiments of the present invention. As shown in FIG. 2, the semiconductor device may include a first seed layer 20a, a first single crystalline silicon layer 22a, a second seed layer 20b, a second single crystalline silicon layer 22b, a third seed layer 20c, and a third single crystalline silicon layer 22c.

The first seed layer 20a may, for example, comprise silicon. The seed layer 20a may comprise an epitaxial layer formed, for example, using a selective epitaxial growth (SEG) process. In the example of the second embodiment of the present invention described below, the first seed layer 20a is formed using a vapor phase epitaxy process. The second and third seed layers 20b and 20c may, but need not be, formed using the same process that is used to form the first seed layer 20a.

The first single crystalline silicon layer 22a may be formed on the first seed layer 20a by transforming the crystal structure of an amorphous silicon layer (not shown) that includes amorphous silicon into a single crystal structure using the silicon in the first seed layer 20a as a seed for crystallization during a phase change of the amorphous silicon layer by a laser. In particular, the amorphous silicon layer may be formed on the first seed layer 20a, and then may be irradiated using a laser to transform the amorphous silicon layer into the first single crystalline silicon layer 22a. Similar processes may be used to form the second single crystalline silicon layer 22b on the second seed layer 20b using the silicon in the second seed layer 20b as a seed for crystallization and to form the third single crystalline silicon layer 22c on the third seed layer 20c using the silicon in the third seed layer 20c as a seed for crystallization. In these embodiments of the present invention, the first seed layer 20a, the first single crystalline silicon layer 22a, the second seed layer 20b, the second single crystalline silicon layer 22b, the third seed layer 20c, and the third single crystalline silicon layer 22c may be sequentially stacked.

Although the above-described second embodiments of the present invention have been described as including first, second and third seed layers and single crystalline silicon layers stacked alternately with each other, additional seed layers and single crystalline silicon layers could be alternatively stacked on the third single crystalline silicon layer, as will be understood by those of ordinary skill in the art in light of the present disclosure. For example, a fourth seed layer (not shown) may be formed on the third single crystalline silicon layer in, for example, the same way as the first seed layer 20a is formed, and a fourth single crystalline silicon layer may be formed on the fourth seed layer in the same way, for example, that the first single crystalline silicon layer 22a is formed in the above description. Additional alternating layers may also be provided. The semiconductor devices according to the second embodiments of the present invention may have single crystalline silicon layers that have a high density of large-sized grains. In these embodiments, a plurality of single crystalline silicon layers may be repeatedly stacked in the device which may facilitate providing highly integrated semiconductor devices.

Hereinafter, exemplary methods of manufacturing semiconductor devices according to certain exemplary embodiments of the present invention will be described with reference to related drawings.

Figure 4:
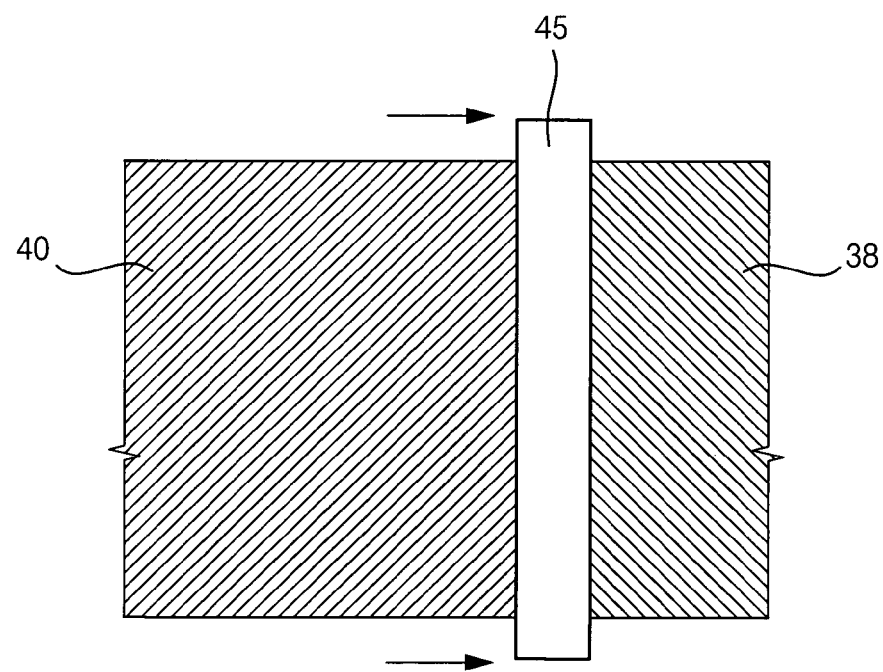
FIG. 4 is a diagram illustrating the laser irradiation of FIG. 3D.
Figure 5:
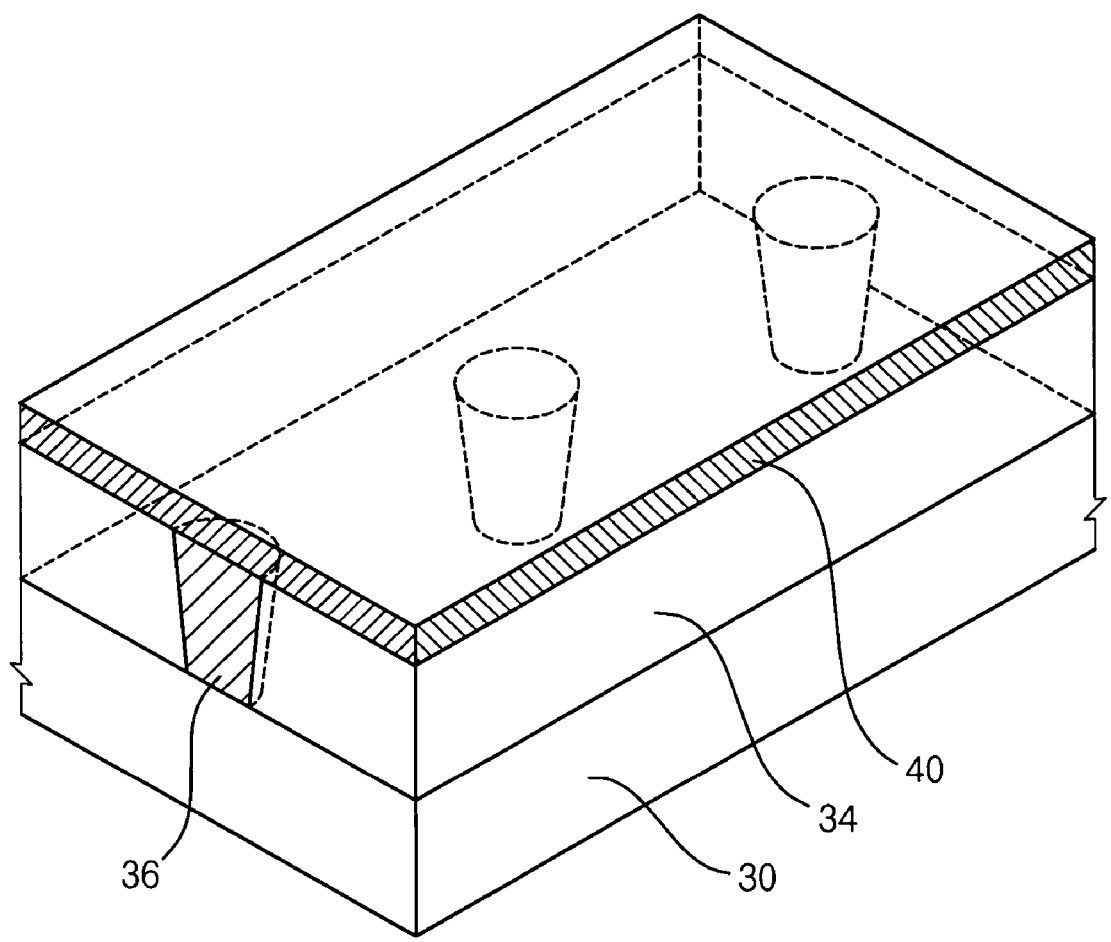
FIG. 5 is a perspective view illustrating a semiconductor device according the first embodiments of the present invention.

FIGS. 3A to 3G are cross-sectional diagrams illustrating methods of manufacturing semiconductor device according to the exemplary embodiments of the present invention. FIG. 4 is a diagram illustrating the laser irradiation shown in FIG. 3D. FIG. 5 is a perspective diagram illustrating a semiconductor device according to the first embodiments of the present invention.

Figure 3A:
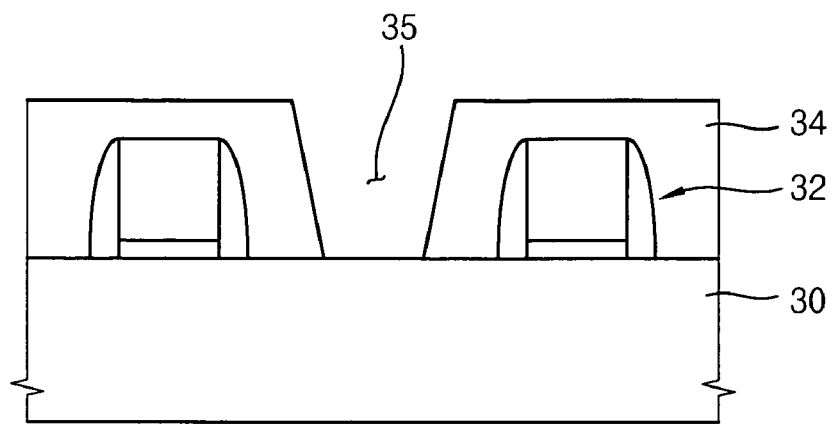
FIGS. 3A to 3G are cross-sectional diagrams illustrating processing steps of methods of manufacturing semiconductor devices according to the first exemplary embodiments of the present invention.

As shown in FIG. 3A, a first semiconductor structure 32 such as a gate electrode may be formed on a substrate 30. The first semiconductor structure 32 may include, for example, metal wirings, a logic device and other various structures as well as the gate electrode. An insulation layer 34 such as, for example, an oxide layer, may be formed on the substrate 30 and the first semiconductor structure 32. An etching process may be performed on the insulation layer 34 using a photoresist pattern as an etching mask to form an opening 35 through which a surface of the substrate 30 is partially exposed.

Figure 3B:
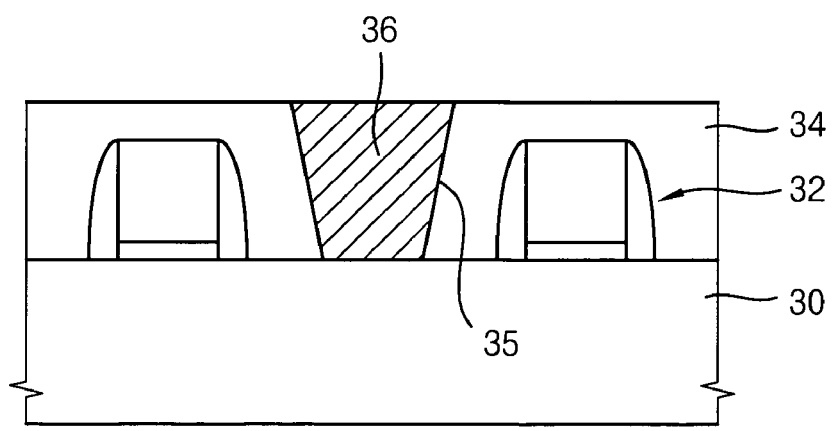

As shown in FIG. 3B, a SEG process may be performed on the silicon substrate 30 including the first semiconductor structure 32. In the exemplary embodiment of the present invention disclosed in FIG. 3B, a vapor phase epitaxy process is the SEG process. A single crystal having the same crystal structure as the silicon substrate 30 may be grown from the surface of the substrate 30 that is exposed through the opening 35 to form a single crystal epitaxial layer 36 in the opening 35. In embodiments of the present invention, the epitaxial layer 36 may be grown to an inlet portion of the opening 35, so that the opening 35 may be filled with the epitaxial layer 36.

Figure 3C:
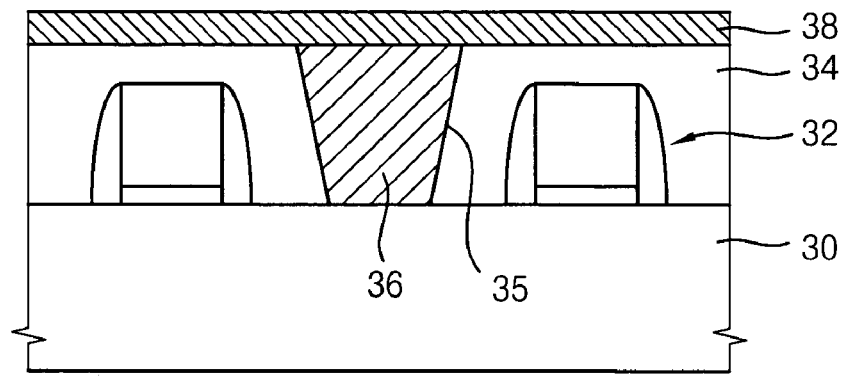

As shown in FIG. 3C, an amorphous silicon layer 38 may be formed on the insulation layer 34 and the epitaxial layer 36 using, for example, a chemical vapor deposition (CVD) process. The amorphous silicon layer 38 is not limited in its thickness. In certain embodiments of the present invention, the amorphous silicon layer may be formed as a very thin layer.

Figure 3D:
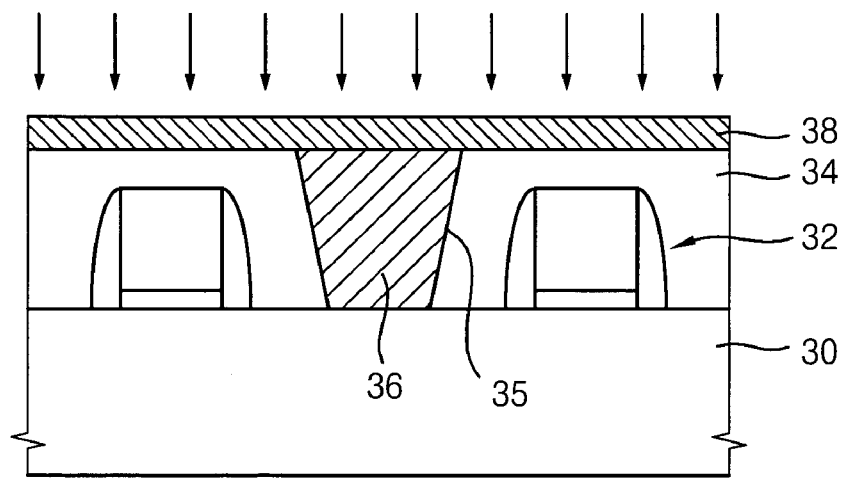

As shown in FIG. 3D, a laser is irradiated onto the amorphous silicon layer 38. In certain embodiments of the present invention, a scanning member 45 may be used such that a predetermined and/or defined area of the amorphous silicon layer 38 may be irradiated at a time, as shown in FIG. 4. Additionally, in certain embodiments of the present invention, the silicon substrate 30 (and/or the entire structure) may be heated during the laser irradiation. Exemplary temperatures to which the substrate/structure may be heated are between about 200° C. and about 600° C. such, as for example, a temperature of about 400° C.

Figure 3E:
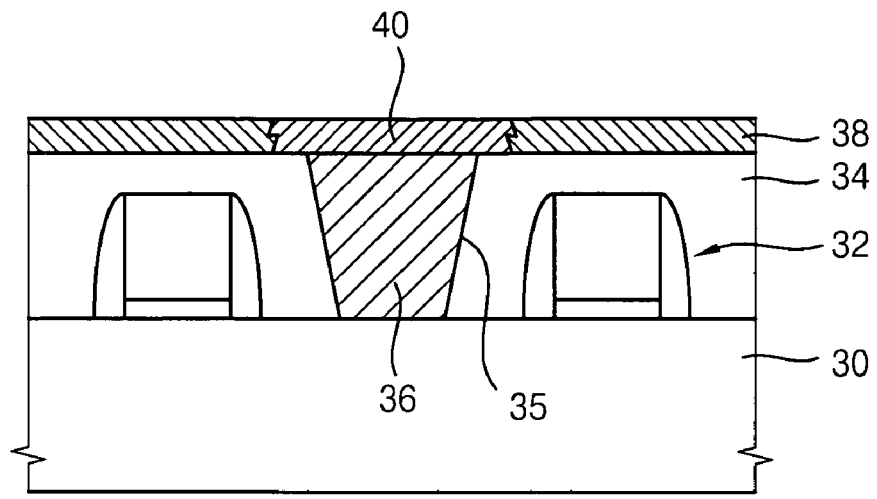
Figure 3F:
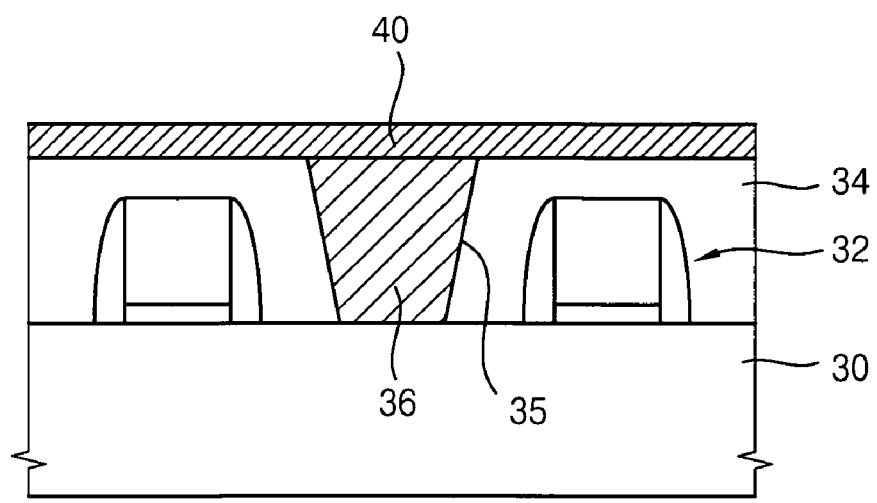

Referring to FIGS. 3E and 3F, the laser irradiation may cause a phase change in the amorphous silicon layer 38. In particular, the amorphous silicon layer 38 may be melted by the laser irradiation such that it is liquefied. The phase of the amorphous silicon layer 38 may be changed throughout the entire thickness of the amorphous silicon layer 38, from the top surface thereof to the bottom surface that makes contact with the epitaxial layer 36. The amorphous silicon layer 38 may be transformed into a single crystal structure during the phase change using the silicon in the epitaxial layer 36 as a seed for crystallization. The amorphous silicon layer 38 may be turned into a single crystalline silicon layer 40 as it is irradiated. After completing the laser irradiation on the whole surface of the amorphous silicon layer 38, the entire amorphous silicon layer 38 may be formed into a single crystalline silicon layer 40, as shown in FIG. 5. The single crystalline silicon layer 40 may be used, for example, to form active region(s) in subsequent processing steps in the manufacture of the semiconductor device. In FIG. 5, the semiconductor structure on the substrate 30 is omitted in order to clearly illustrate the single crystalline silicon layer 40.

Thus, the laser irradiation on the amorphous silicon layer 38 may be used to transform the amorphous silicon layer 38 into the single crystalline silicon layer 40 using the epitaxial layer 36 as a seed for crystallization. The single crystalline silicon layer 40 may include a relatively high density of relatively large grains.

Figure 3G:
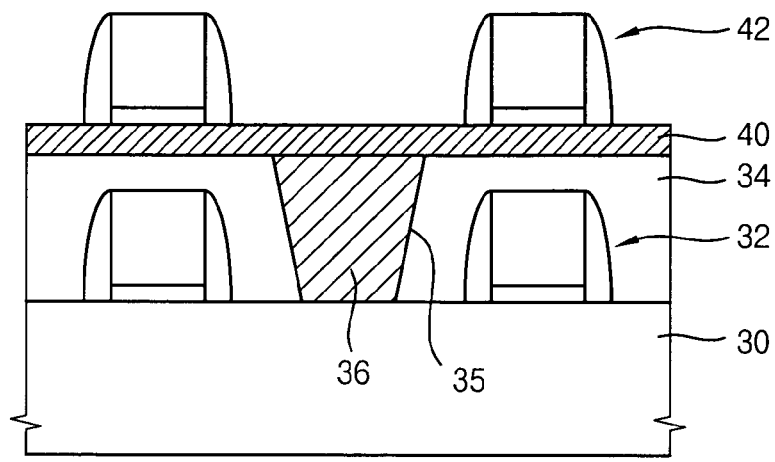

As shown in FIG. 3G, a second semiconductor structure 42 such as, for example, a gate electrode, may be formed on the single crystalline silicon layer 40. A channel and source/drain regions may also be formed at surface portions of the single crystalline silicon layer 40. It will be appreciated that the semiconductor structure 42 may also include metal wirings, a logic device and other various structures as well as the gate electrode.

Figure 6A:
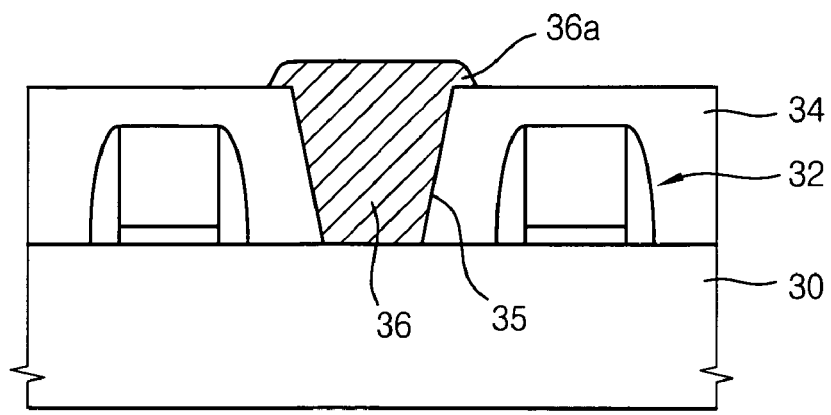
FIGS. 6A to 6B are cross-sectional diagrams illustrating processing steps of methods of manufacturing semiconductor devices according to the second exemplary embodiments of the present invention.
Figure 6B:
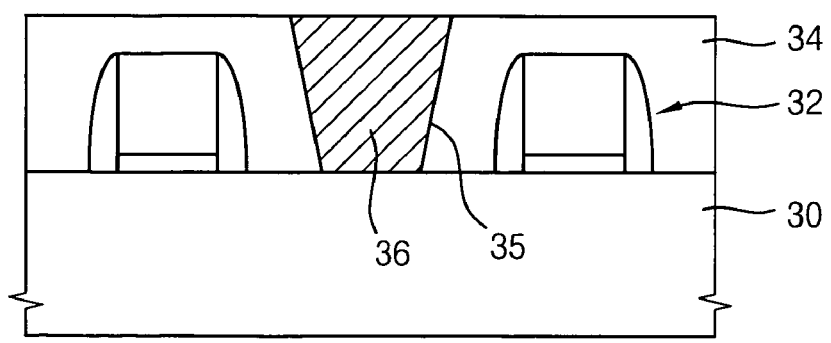

FIGS. 6A to 6B are cross-sectional diagrams illustrating processing steps according to embodiments of the present invention for manufacturing, for example, the semiconductor device discussed above with respect to the second embodiments of the present invention.

As shown in FIG. 6A, a semiconductor structure 32 such as, for example, a gate electrode may be formed on a substrate 30 in, for example, the same manner as is described above with respect to the embodiments discussed with respect to FIGS. 3-5. Then, an insulation layer 34 may be formed on the substrate 30. The insulation layer may include an opening 35 through which a surface of the substrate 30 is partially exposed. A SEG process may be performed on the silicon substrate 30 including the semiconductor structure 32. The SEG process may comprise, for example, a vapor phase epitaxy process. As a result, a single crystal that has the same crystal structure as the silicon substrate 30 may be grown from the surface of the substrate 30 that is exposed through the opening 35 to thereby form an epitaxial layer 36 that includes a single crystal in the opening 35. The epitaxial layer 36 may be grown over an inlet portion of the opening 35, so that a top surface of the insulation layer 34 around the inlet portion of the opening 35 is covered with the epitaxial layer 36. In the drawings, the epitaxial layer 36 on the insulation layer 34 is denoted by reference numeral 36a to distinguish it from the epitaxial layer 36 in the opening 35.

Referring to FIG. 6B, the epitaxial layer 36a on the insulation layer 34 may be removed from the top surface of the insulation layer 34 using, for example, a chemical mechanical polishing (CMP) process. The CMP (or other) process may be used to expose the insulation layer 34. As shown in FIG. 6B, the epitaxial layer 36 remains in the opening 35. Next, a single crystalline silicon layer may be formed using, for example, the same process that is described above with respect to the embodiments of FIGS. 3-5, and a semiconductor device may be formed on the single crystalline silicon layer.

Figure 7:
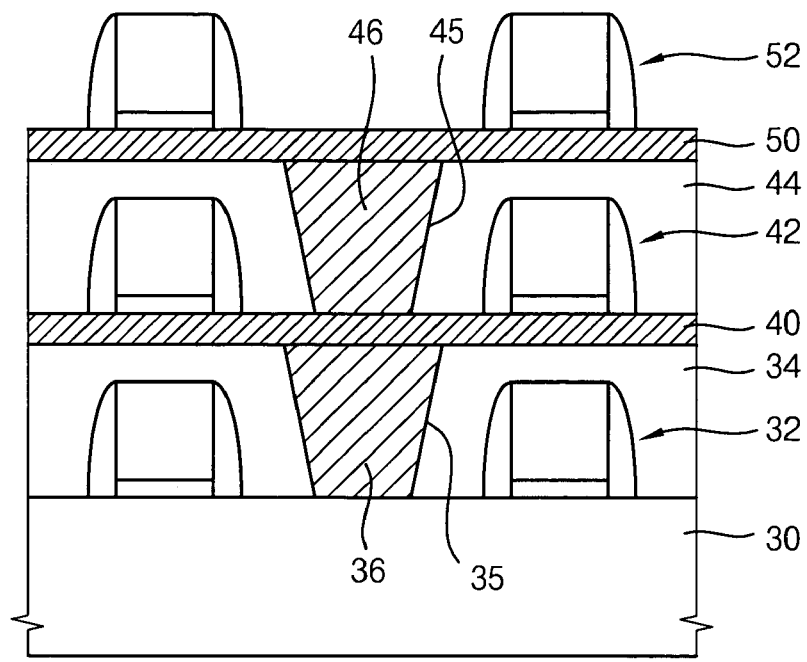
FIG. 7 is a cross-sectional diagram illustrating methods of manufacturing semiconductor devices according to third exemplary embodiments of the present invention.

FIG. 7 is a cross sectional diagram illustrating methods of manufacturing semiconductor devices according to third exemplary embodiments of the present invention. The semiconductor devices formed according to these embodiments may have the same basic structure as the semiconductor devices discussed above with respect to the first embodiments, except that the basic structure is repeated to provide a semiconductor device in which the basic structure is repeatedly stacked. In the description that follows, the insulation layer 34, the opening 35, the epitaxial layer 36 and the single crystalline silicon layer 40 in the first embodiments of the present invention are referred to as the first insulation layer 34, the first opening 35, the first epitaxial layer 36 and the first single crystalline silicon layer 40, respectively, for purposes of describing the present embodiments of the present invention.

As shown in FIG. 7, a first semiconductor structure 32 (such as, for example, a gate electrode), a first insulation layer 34 having a first opening 35, a first epitaxial layer 36 in the first opening 35, a first single crystalline silicon layer 40 and a second semiconductor structure 42 are formed on a silicon substrate 30. These layers and structures may be formed, for example, in the same manner as the corresponding structures and layers are formed in the embodiments of the present invention described above. Next, a second insulation layer 44 may be formed on the first single crystalline silicon layer 40. The second insulation layer 44 may have a second opening 45 through which a surface of the first single crystalline silicon layer 40 is partially exposed in, for example, the same manner as described for the first insulation layer 34.

A second epitaxial layer 46 may be grown in the second opening 45. The second epitaxial layer 46 may be formed in the second opening 45, for example, as the first epitaxial layer 36 is formed in the first opening 35. A second single crystalline silicon layer 50 may be formed on the second insulation layer 44 and the second epitaxial layer 46. The second single crystalline silicon layer 50 may, for example, be used as an active region of the semiconductor device.

Next, a third semiconductor structure 52 such as, for example, a gate electrode, may be formed on the second single crystalline silicon layer 50. A channel and source/drain regions may likewise be formed at surface portions of the second single crystalline silicon layer 50. The third semiconductor structure 52 may further include metal wirings, a logic device and/or other various structures.

In further embodiments of the present invention, additional single crystalline silicon layers and semiconductor structures may be stacked on the second single crystalline silicon layer.

Figure 8:
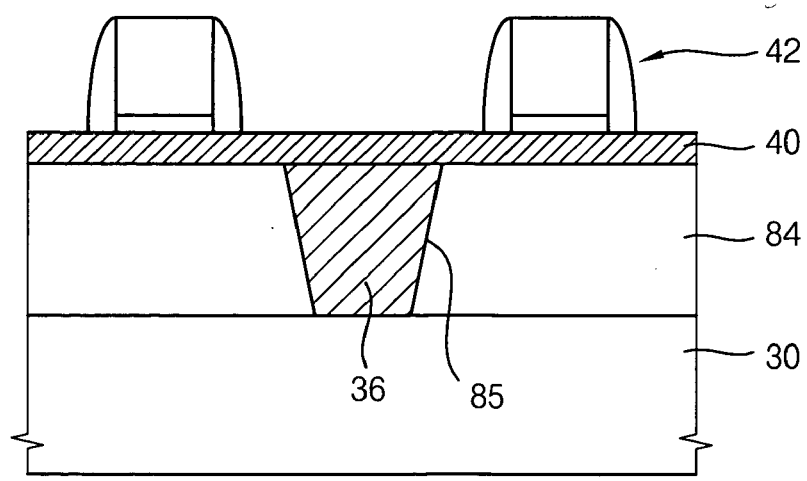
FIG. 8 is a cross-sectional diagram illustrating methods of manufacturing semiconductor devices according to fourth exemplary embodiments of the present invention.

FIG. 8 is a cross-sectional diagram illustrating methods of manufacturing semiconductor devices according to fourth exemplary embodiments of the present invention. As shown in FIG. 8, an insulation layer 84 that comprises, for example, an oxide layer is formed on a silicon substrate 30. An opening 85 is provided in the insulation layer 84 through which a surface of the substrate 30 is partially exposed. An epitaxial layer 36 is formed in the opening 85. Then, a single crystalline silicon layer 40 may be formed on the insulation layer 84 and the epitaxial layer 36 in, for example, the same manner described above with respect to the first embodiments of the present invention. A semiconductor structure 42 such as, for example, a gate electrode may then be formed on the single crystalline silicon layer 40.

In yet further embodiments of the present invention, a silicon-on-insulator (SOI) substrate may be used instead of the silicon substrate that is used with respect to the above-described exemplary embodiments of the present invention. For example, in one such embodiment, a first semiconductor structure and an insulation layer having an opening may be formed on the SOI substrate. An epitaxial layer may be formed in the opening. A single crystalline silicon layer may then be formed on the silicon layer and the epitaxial layer, and a second semiconductor structure may be formed on the single crystalline silicon layer.

EXAMPLE 1

A single crystalline silicon layer was formed in accordance with the first embodiments of the present invention. The amorphous silicon layer was formed to have a thickness of about 250 Å, and a laser having an energy intensity of about 240 mJ/cm$^2$ was irradiated onto the amorphous silicon layer.

Figure 9A:
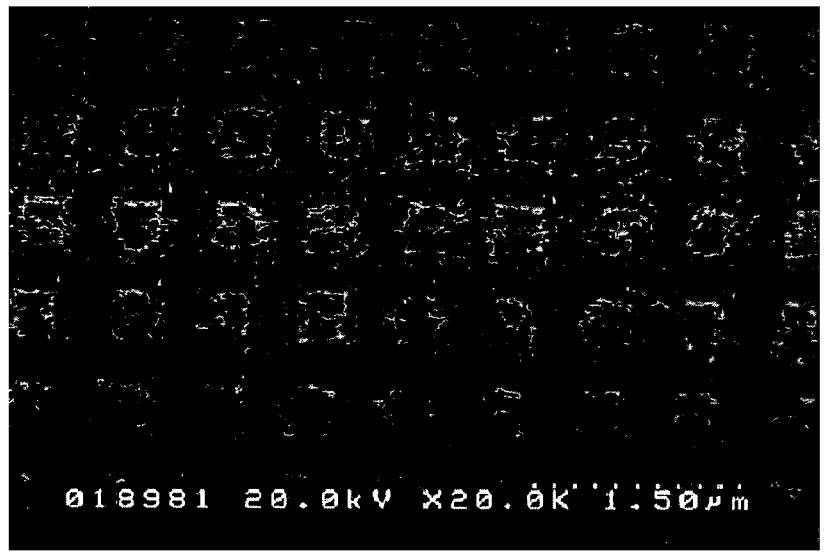
FIGS. 9A and 9B are scanning electron microscope (SEM) photographs of a surface of a single crystalline silicon layer manufactured according to embodiments of the present invention.
Figure 9B:

FIGS. 9A and 9B are scanning electron microscope (SEM) photographs of the surface of the single crystalline silicon layer. FIG. 9B is an enlarged view illustrating one of the grains shown in FIG. 9A.

FIG. 9A shows that high-density grains were formed in the single crystalline silicon layer, and the size of the grains in the single crystalline silicon layer was estimated to be about 2000 Å wide by about 2000 Å long, as indicated in FIG. 9B.

EXAMPLE 2

A second single crystalline silicon layer was formed in the same way as the single crystalline silicon layer of Example 1, except that the laser had an energy intensity of about 300 mJ/cm$^2$.

Figure 10A:
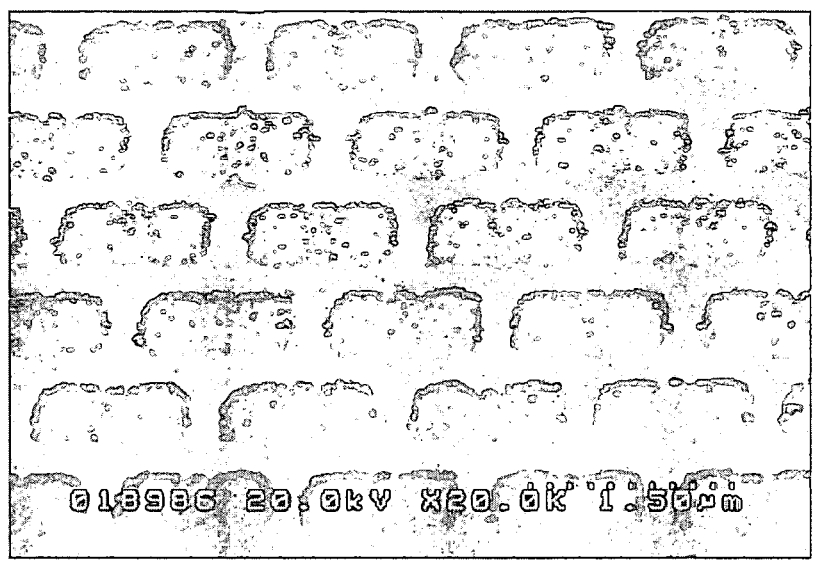
FIGS. 10A and 10B are SEM photographs of a surface of another single crystalline silicon layer manufactured according to embodiments of the present invention.
Figure 10B:
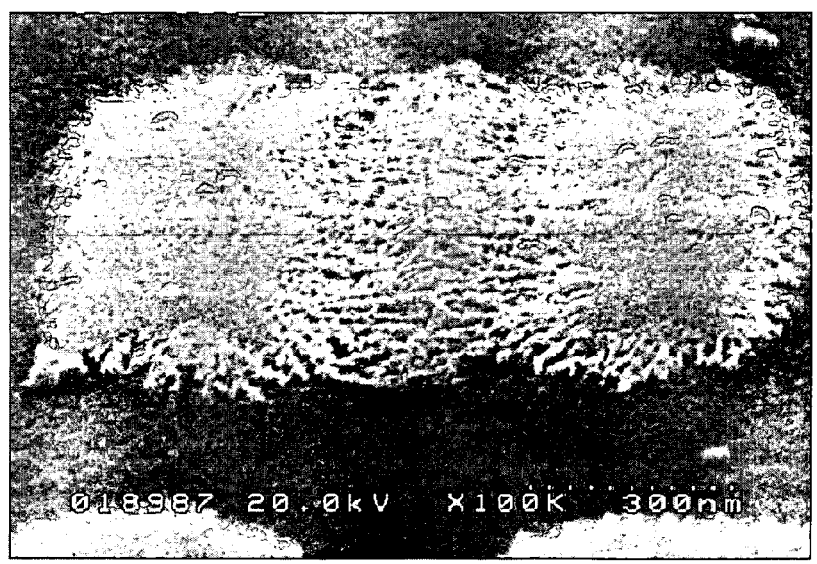

FIGS. 10A and 10B are SEM photographs of the surface of the single crystalline silicon layer of Example 2. FIG. 10B is an enlarged view illustrating one of the grains shown in FIG. 10A.

FIG. 10A shows that high-density grains were formed in the single crystalline silicon layer of Example 2, and a size of these grains was estimated to be about 5.5 μm wide by about 1.5 μm long, as indicated in FIG. 10B.

COMPARATIVE EXAMPLE

Figure 11A:
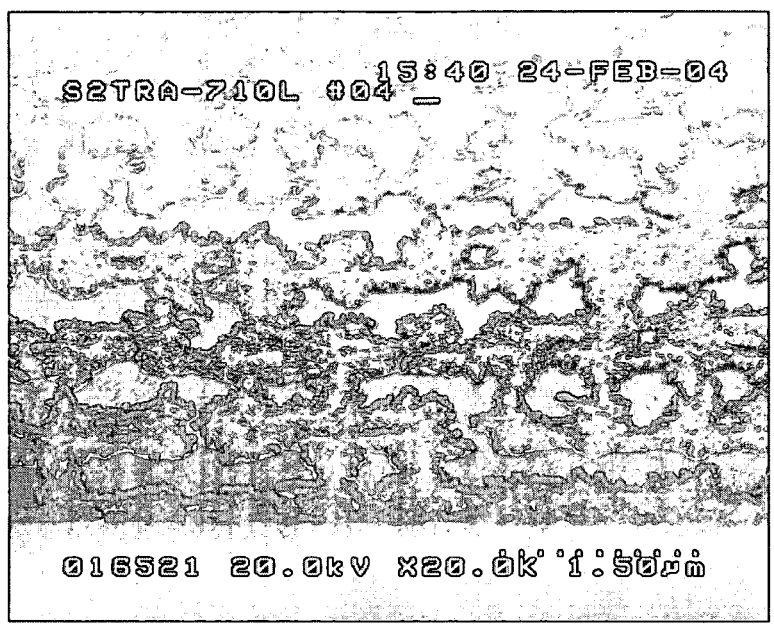
FIGS. 11 and 11B are SEM photographs of a surface of the conventional single crystalline silicon layer.
Figure 11B:
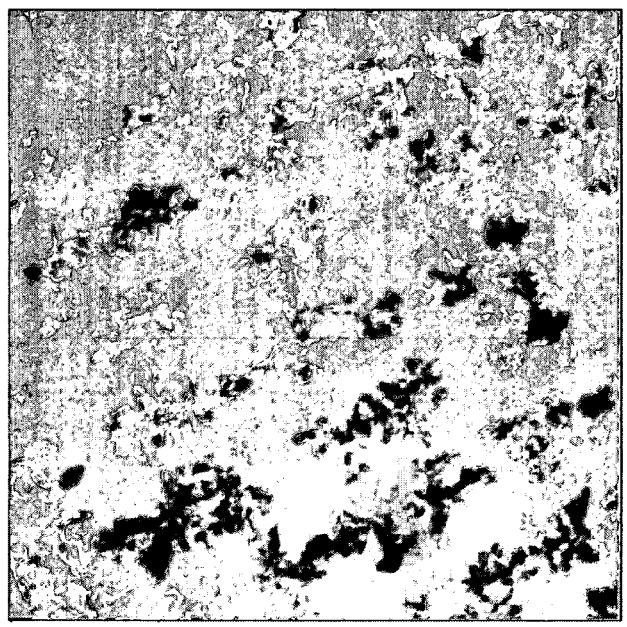

A conventional single crystalline silicon layer was obtained in a furnace by a heat treatment at a temperature of about 600° C. FIGS. 11 and 11B are SEM photographs of the surface of this single crystalline silicon layer. In particular, FIG. 11B is an enlarged view illustrating one of the grains shown in FIG. 11A.

FIG. 11A shows that the grains were randomly arranged in the conventional single crystalline silicon layer. The size of the grain in the conventional single crystalline silicon layer could not be estimated because size of the grain was too small to estimate, as indicated in FIG. 9B.

According to embodiments of the present invention, single crystalline silicon layers may be provided that have a plurality of large grains at a high density.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of manufacturing a semiconductor device, comprising:
   forming a first single crystalline seed layer that includes silicon on a substrate using a selective epitaxial growth (SEG) process;
   forming a first non-single crystalline silicon layer on the first single crystalline seed layer; and
   irradiating the first non-single crystalline silicon layer with a laser to transform the first non-single crystalline silicon layer into a first single crystalline silicon layer.

2. The method of claim 1, wherein the transformation occurs during a phase change of the first non-single crystalline silicon by the laser.

3. The method of claim 2, wherein the silicon in the first seed layer acts as a seed for crystallization of the first non-single crystalline layer.

4. The method of claim 1, wherein the SEG process comprises a vapor phase epitaxy process.

5. The method of claim 1, wherein irradiating the first non-single crystalline silicon layer with a laser comprises using the laser to liquefy substantially all of the first non-single crystalline silicon layer so as to convert the entirety of the first non-single crystalline silicon layer into a large-grained single crystalline layer.

6. The method of claim 5, further comprising heating the first seed layer using a heating source separate from the laser during at least part of the time during which the laser is irradiated onto the first non-single crystalline silicon layer.

7. The method of claim 6, wherein the first seed layer is heated at a temperature in the range of about 200° C. to about 600° C. via the separate heating source.

8. The method of claim 1, wherein forming a first non-single crystalline silicon layer on the first seed layer comprises forming an amorphous silicon layer on the first seed layer.

9. The method of claim 1, further comprising:
   forming a second seed layer that includes silicon on the first single crystalline silicon layer;
   forming a second non-single crystalline silicon layer on the second seed layer;
   irradiating the second non-single crystalline silicon layer with a laser to transform the second non-single crystalline silicon layer into a second single crystalline silicon layer, wherein the silicon in the second seed layer acts as a seed for crystallization of the second non-single crystalline layer; and then
   forming a third seed layer that includes silicon on the second single crystalline silicon layer;

forming a third non-single silicon crystalline layer on the third seed layer; and irradiating the third non-single crystalline silicon layer with a laser to transform the third non-single crystalline silicon layer into a third single crystalline silicon layer, wherein the silicon in the third seed layer acts as a seed for crystallization of the third non-single crystalline layer.

10. The method of claim 2, wherein the phase change comprises a change to a liquid state and wherein the first non-single crystalline silicon layer does not flow across the surface of the seed layer after the first non-single crystalline silicon layer is liquefied.

11. The method of claim 1, wherein the laser is irradiated onto the first non-single crystalline silicon layer at a sufficient intensity to liquefy the first non-single crystalline silicon layer through substantially its whole thickness in less than about 100 nanoseconds.

12. The method of claim 11, wherein the seed layer and the first non-single crystalline silicon layer have different absorption coefficients such that they absorb energy from the laser at different rates.

13. The method of claim 1, wherein the first single crystalline silicon layer and the first seed layer have substantially the same Miller's index.

14. A method of manufacturing a semiconductor device, comprising:

providing a first single crystalline silicon layer;

forming a first insulation layer on the first single crystalline silicon layer, the first insulation layer including an opening that exposes a surface of the first single crystalline silicon layer;

forming a first seed layer in the opening, the first seed layer including silicon;

forming a non-single crystalline silicon layer on the first insulation layer and the first seed layer; and transforming the non-single crystalline silicon layer into a second single crystalline silicon layer using the silicon in the first seed layer as a seed for crystallization during a phase change of the non-single crystalline silicon in the non-single crystalline silicon layer that is induced by application of a laser.

15. The method of claim 14, wherein the first single crystalline silicon layer comprises a silicon substrate or a silicon-on-insulator (SOI) substrate.

16. The method of claim 14, wherein the non-single crystalline silicon layer comprises an amorphous silicon layer.

17. The method of claim 14, wherein the second single crystalline silicon layer and the first seed layer have substantially the same Miller's index.

18. The method of claim 14, wherein forming the first seed layer comprises forming the first seed layer using a selective epitaxial growth (SEG) process.

19. The method of claim 14, wherein transforming the non-single crystalline silicon layer into a second single crystalline silicon layer using the silicon in the first seed layer as a seed for crystallization during a phase change of the non-single crystalline silicon in the non-single crystalline silicon layer that is induced by application of a laser comprises:

melting the non-single crystalline silicon layer using the laser; and recrystallizing the dissolved non-single crystalline silicon layer into the second single crystalline silicon layer using the first seed layer as a seed during the recrystallization process.

20. The method of claim 14, further comprising heating the first seed layer using a heating source separate from the laser during at least part of the time during which the laser is irradiated onto the non-single crystalline silicon layer.

21. The method of claim 20, wherein the first seed layer is heated at a temperature in the range of about 200° C. to about 600° C. via the separate heating source.

22. The method of claim 14, further comprising forming a semiconductor structure on the first single crystalline silicon layer prior to forming the first seed layer.

23. The method of claim 14, further comprising polishing the first seed layer until an inlet portion of the opening is exposed.

24. The method of claim 14, wherein the laser is irradiated onto the non-single crystalline silicon layer at a sufficient intensity to liquefy the non-single crystalline silicon layer through substantially its whole thickness.

25. The method of claim 24, wherein the liquefied non-single crystalline silicon layer does not flow onto the surface of the seed layer.

26. The method of claim 14, wherein the seed layer and the non-single crystalline silicon layer have different absorption coefficients.

27. The method of claim 14, further comprising:

forming a second insulation layer on the second single crystalline silicon layer, the second insulation layer including an opening that exposes a surface of the second single crystalline silicon layer;

forming a second seed layer in the opening, the second seed layer including silicon;

forming a second non-single crystalline silicon layer on the second insulation layer and the second seed layer;

transforming the second non-single crystalline silicon layer into a third single crystalline silicon layer using the silicon in the second seed layer as a seed for crystallization during a phase change of the non-single crystalline silicon in the second non-single crystalline silicon layer that is induced by application of a laser; and then forming a third insulation layer on the third single crystalline silicon layer, the third insulation layer including an opening that exposes a surface of the third single crystalline silicon layer;

forming a third seed layer in the opening, the third seed layer including silicon;

forming a third non-single crystalline silicon layer on the third insulation layer and the third seed layer;

transforming the third non-single crystalline silicon layer into a fourth single crystalline silicon layer using the silicon in the third seed layer as a seed for crystallization during a phase change of the non-single crystalline silicon in the third non-single crystalline silicon layer that is induced by application of the laser.

28. The method of claim 14, wherein the first insulation layer comprises an oxide layer.

29. A method of manufacturing a semiconductor device, comprising:

providing a first single crystalline silicon layer;

forming a first insulation layer on the first single crystalline silicon layer, the first insulation layer including an opening that exposes a surface of the first single crystalline silicon layer;

forming a first seed layer in the opening using a selective epitaxial growth (SEG) process, the first seed layer including silicon;

forming an amorphous silicon layer on the first insulation layer and the first seed layer; and transforming the amorphous silicon layer into a second single crystalline silicon layer using the silicon in the first seed layer as a seed for crystallization during a phase change of the amorphous silicon in the amorphous silicon layer that is induced by application of a laser.

30. The method of claim 29, further comprising heating the first seed layer using a heating source separate from the laser during at least part of the time during which the laser is irradiated onto the amorphous silicon layer.

31. The method of claim 30, wherein the first seed layer is heated at a temperature in the range of about 200° C. to about 600° C. via the separate heating source.

32. The method of claim 30, further comprising forming a semiconductor structure on the first single crystalline silicon layer prior to forming the first seed layer.

33. The method of claim 32, further comprising polishing the first seed layer until an inlet portion of the opening is exposed.

34. The method of claim 33, wherein the laser is irradiated onto the amorphous silicon layer at a sufficient intensity to liquefy the amorphous silicon layer through substantially its whole thickness in less than about 100 nanoseconds.

35. The method of claim 34, wherein the liquefied amorphous silicon layer does not flow onto the surface of the seed layer.

36. The method of claim 35, further comprising:
forming a second insulation layer on the second single crystalline silicon layer, the second insulation layer including an opening that exposes a surface of the second single crystalline silicon layer;
forming a second seed layer in the opening, the second seed layer including silicon;
forming a second non-single crystalline silicon layer on the second insulation layer and the second seed layer;
transforming the second non-single crystalline silicon layer into a third single crystalline silicon layer using the silicon in the second seed layer as a seed for crystallization during a phase change of the non-single crystalline silicon in the second non-single crystalline silicon layer that is induced by application of a laser; and then
forming a third insulation layer on the third single crystalline silicon layer, the third insulation layer including an opening that exposes a surface of the third single crystalline silicon layer;
forming a third seed layer in the opening, the third seed layer including silicon;
forming a third non-single crystalline silicon layer on the third insulation layer and the third seed layer;
transforming the third non-single crystalline silicon layer into a fourth single crystalline silicon layer using the silicon in the third seed layer as a seed for crystallization during a phase change of the non-single crystalline silicon in the third non-single crystalline silicon layer that is induced by application of the laser.

37. The method of claim 36, wherein the seed layer and the non-single crystalline silicon layer have different absorption coefficients.

* * * * *